United States Patent
Kang et al.

(10) Patent No.: US 7,595,246 B2
(45) Date of Patent: Sep. 29, 2009

(54) METHODS OF MANUFACTURING FIELD EFFECT TRANSISTORS HAVING ELEVATED SOURCE/DRAIN REGIONS

(75) Inventors: Min-Gu Kang, Seoul (KR); Ki-Hong Kim, Gyeonggi-do (KR); Jin-Bum Kim, Seoul (KR); Jung-Yun Won, Gyeonggi-do (KR); In-Sun Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 242 days.

(21) Appl. No.: 11/636,139

(22) Filed: Dec. 8, 2006

(65) Prior Publication Data

US 2007/0134880 A1 Jun. 14, 2007

(30) Foreign Application Priority Data

Dec. 12, 2005 (KR) ........................ 10-2005-0121444

(51) Int. Cl.
*H01L 21/336* (2006.01)
(52) U.S. Cl. ................... 438/300; 257/E21.43
(58) Field of Classification Search ................ 438/300; 257/E21.132, E21.43
See application file for complete search history.

(56) References Cited

U.S. PATENT DOCUMENTS 6,190,453 B1 * 2/2001 Boydston et al. ............... 117/89
6,436,776 B2 8/2002 Nakayama et al. ........... 438/305

FOREIGN PATENT DOCUMENTS

| JP | 2000-269500 | 9/2000 |
|---|---|---|
| KR | 10200041382 | 7/2000 |
| KR | 1020000054890 | 9/2000 |
| KR | 1020010003652 | 1/2001 |
| KR | 1020040098302 | 11/2004 |

OTHER PUBLICATIONS

Korean Office Action for 1020050121444 dated Dec. 4, 2006 with English Translation.

* cited by examiner

*Primary Examiner*—Chandra Chaudhari
(74) *Attorney, Agent, or Firm*—Myers Bigel Sibley & Sajovec

(57) ABSTRACT

Methods of manufacturing a field effect transistor include forming a gate pattern on a substrate. A gate spacer is formed on a sidewall of the gate pattern. A first layer is formed from a surface of the substrate and contacting the gate spacer using a first selective epitaxial growth (SEG) process at a first temperature. A second layer is formed from a surface of the first layer and contacting the gate spacer using a second SEG process at a second temperature. The second temperature is lower than the first temperature. The first and second layers define elevated source/drain regions.

17 Claims, 4 Drawing Sheets

METHODS OF MANUFACTURING FIELD EFFECT TRANSISTORS HAVING ELEVATED SOURCE/DRAIN REGIONS

CROSS-REFERENCE TO RELATED APPLICATION

This application is related to and claims priority under 35 USC § 119 from Korean Patent Application No. 2005-121444, filed on Dec. 12, 2005 in the Korean Intellectual Property Office, the disclosure of which is incorporated herein by reference in its entirety.

BACKGROUND OF THE INVENTION

The present invention relates to semiconductor memory devices and, more particularly, to source/drain regions of semiconductor memory devices and methods of manufacturing the same.

As the density of integrated circuit (semiconductor) memory devices continues to increase, and the corresponding design rule of the devices becomes finer, a width of a gate pattern in the semiconductor memory devices has been gradually reduced. An effective channel length of the gate pattern has also been shortened as the width of the gate pattern decreases. As a result, a short channel effect, resulting in a punch-through effect between a source region and a drain region, may be more frequently generated.

Source/drain regions having a lightly doped drain (LDD) structure capable of allowing a shallow junction may be used to address the punch-through effect. However, when the width of the gate pattern is no greater than about 0.35 µm, the source/drain regions having the LDD structure may not sufficiently suppress the short channel effect because of limitations on forming of the shallow junction in the source/drain regions having the LDD structure. Elevated source/drain regions formed by a selective epitaxial growth (SEG) process may, therefore, be used in semiconductor memory devices having a gate pattern, which has, for example, a width of no more than about 0.35 µm, to suppress the short channel effect.

An example of a semiconductor memory device having elevated source/drain regions using an SEG process is described in Korean Patent Laid-Open Publication No. 2004-98302. FIG. 1 is a cross-sectional view illustrating a semiconductor memory device having elevated source/drain regions that are formed by a conventional method.

Referring to FIG. 1, a gate pattern 12 is shown formed on a semiconductor (integrated circuit) substrate 10. A gate spacer 14 is shown formed on a sidewall of the gate pattern 12. The illustrated gate pattern 12 includes a gate insulation layer, a gate conductive layer and a hard mask layer that are sequentially stacked. The gate spacer 14 may be silicon nitride.

As also illustrated in FIG. 1, source/drain regions 16a and 16b are formed on the semiconductor substrate 10. The source/drain regions 16a and 16b make contact with the gate spacer 14. In other words, the source/drain regions 16a and 16b have an elevated structure relative to an upper surface of the semiconductor substrate 10.

The elevated source/drain regions 16a and 16b may be formed by an SEG process. The above-mentioned Korean Patent describes a method of forming the elevated source/drain regions by performing an SEG process twice. Specifically, after a first SEG process is carried out at a low temperature, a second SEG process is performed at a high temperature.

However, when the elevated source/drain regions 16a and 16b are formed by the SEG process, a large number of facets may be generated at upper edge portions of the elevated source/drain regions 16a and 16b where they contact with the gate spacer 14. When the second SEG process is carried out at a high temperature, the facets may be generated more frequently at the upper edge portions of the elevated source/drain regions. That is, although the elevated source/drain regions may have some improved properties when generated by the second SEG process at a high temperature, as compared with the first SEG process at a low temperature, the problematic facets may be more frequently generated by the second SEG process.

When the elevated source/drain regions 16a and 16b are doped with impurities, the impurities may be implanted into relatively deep positions in the elevated source/drain regions 16a and 16b through the facets so that the short channel effect may be still generated.

SUMMARY OF THE INVENTION

Some embodiments of methods of manufacturing a field effect transistor that may be used in a semiconductor memory device include forming a gate pattern on a substrate. A gate spacer is formed on a sidewall of the gate pattern. A first layer is formed from a surface of the substrate and contacting the gate spacer using a first selective epitaxial growth (SEG) process at a first temperature. A second layer is formed from a surface of the first layer and contacting the gate spacer using a second SEG process at a second temperature. The second temperature is lower than the first temperature. The first and second layers define elevated source/drain regions.

In further embodiments, the substrate is a single-crystalline silicon substrate, a single-crystalline germanium substrate and/or a single-crystalline silicon germanium substrate and the first and second layers are a single-crystalline silicon layer, a single-crystalline germanium layer and/or a single-crystalline silicon germanium layer. The first layer may be formed at between about 630° C. to about 700° C. and the second layer may be formed at between about 600° C. to about 670° C.

In other embodiments, forming the first layer includes introducing a first source gas at a first flow rate for a first duration and forming the second layer includes introducing a second source gas at a second flow rate greater than the first flow rate for a second duration shorter than the first duration. Forming the first layer may include introducing the first source gas at about 70 sccm to about 90 sccm for about 20 seconds to about 30 seconds. Forming the second layer may include introducing the second source gas at about 80 sccm to about 100 sccm for about 15 seconds to about 25 seconds. The first and second source gases may be $SiH_4$, $Si_2H_6$, $Si_3H_8$, $SiH_3Cl$, $Si_2H_2Cl_2$ and/or $SiHCl_3$.

In further embodiments, forming the first and second layers includes forming the first and second layers to a thickness of about 5 Å to about 95 Å. Forming the first and second layers may be followed by doping the first and second layers with impurities. The impurities may be boron, phosphorous and/or arsenic.

In other embodiments, forming the first layer includes forming a portion of the first layer, surface-treating the formed portion of the first layer and repeating forming the portion of the first layer and treating the formed portion of the first layer. Forming the second layer may include forming a portion of the second layer, surface-treating the formed portion of the second layer and repeating forming the portion of the second layer and treating the formed portion of the second layer.

In yet other embodiments, the first layer is formed with an associated crystal grain size and the second layer is formed with an associated crystal grain size different from the associated crystal grain size of the first layer. The first layer may be formed with an associated interface characteristic and the second layer may be formed with an associated interface characteristic lower than the interface characteristic of the first layer.

In further embodiments forming the first layer includes forming the first layer with an associated incidence of facets at an interface thereof with the gate spacer. Forming the second layer includes forming the second layer with an associated incidence of facets at an interface thereof with the gate spacer lower than the incidence of facets at an interface of the first layer with the gate spacer. Forming the first layer and forming the second layer may be followed by uniformly doping the first and second layers with impurities.

In other embodiment, forming the first layer includes forming the first layer at between about 630° C. to about 700° C. and forming the second layer includes forming the second layer at between about 600° C. to about 670° C. Forming the second layer may include forming the second layer at between about 620° C. to about 640° C.

In further embodiments, the first and second SEG processes are a single SEG process performed with a decreasing temperature during the single SEG process to provide the elevated source/drain regions.

In yet further embodiments, field effect transistors that may be used in semiconductor memory devices include a semiconductor substrate and a gate pattern on the substrate. A gate spacer is on a sidewall of the gate pattern and elevated source/drain regions are on a surface of the substrate and contacting the gate spacer. The elevated source/drain regions include a first layer and a second layer. The first layer is on the surface of the substrate and has an associated crystal grain size. The second layer is on the first layer and has an associated crystal grain size different from the associated crystal grain size of the first layer.

The substrate may be a single-crystalline silicon substrate, a single-crystalline germanium substrate and/or a single-crystalline silicon germanium substrate. The first and second layers may be a single-crystalline silicon layer, a single-crystalline germanium layer and/or a single-crystalline silicon germanium layer. The first and second layers may be doped with impurities. The first layer may have a thickness of about 5 Å to about 95 Å and the second layer may have a thickness of about 5 Å to about 95 Å and the elevated source/drain regions may have a thickness of about 10 Å to about 100 Å.

In yet other embodiments, field effect transistors that may be used in semiconductor memory devices include a semiconductor substrate and a gate pattern on the substrate. A gate spacer is on a sidewall of the gate pattern and elevated source/drain regions are on a surface of the substrate and contacting the gate spacer. The elevated source/drain regions include a first layer and a second layer. The first layer is on the surface of the substrate and has an associated incidence of facets at an interface thereof with the gate spacer. The second layer is on the first layer and has an associated incidence of facets at an interface thereof with the gate spacer lower than the incidence of facets at an interface of the first layer with the gate spacer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
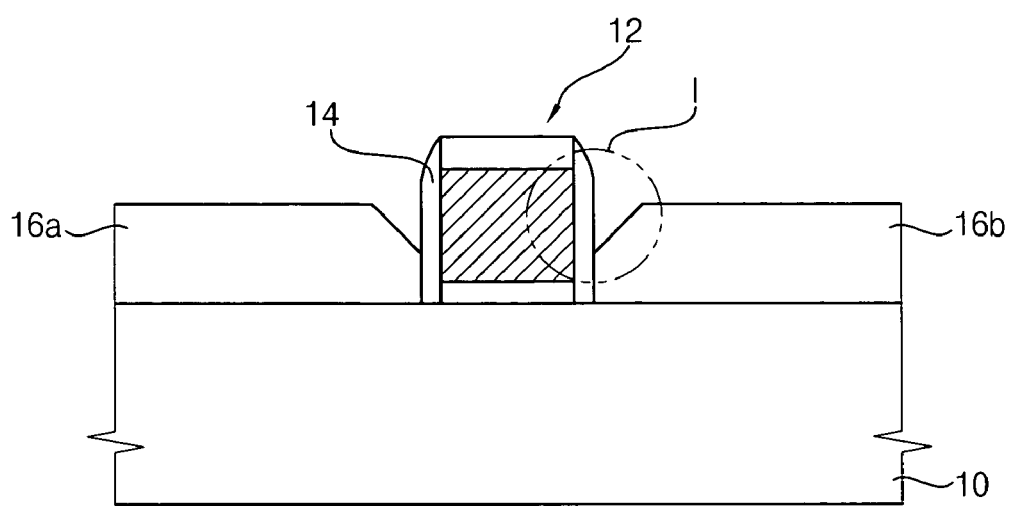
FIG. 1 is a cross-sectional view illustrating a semiconductor memory device having elevated source/drain regions that are formed by a conventional method.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
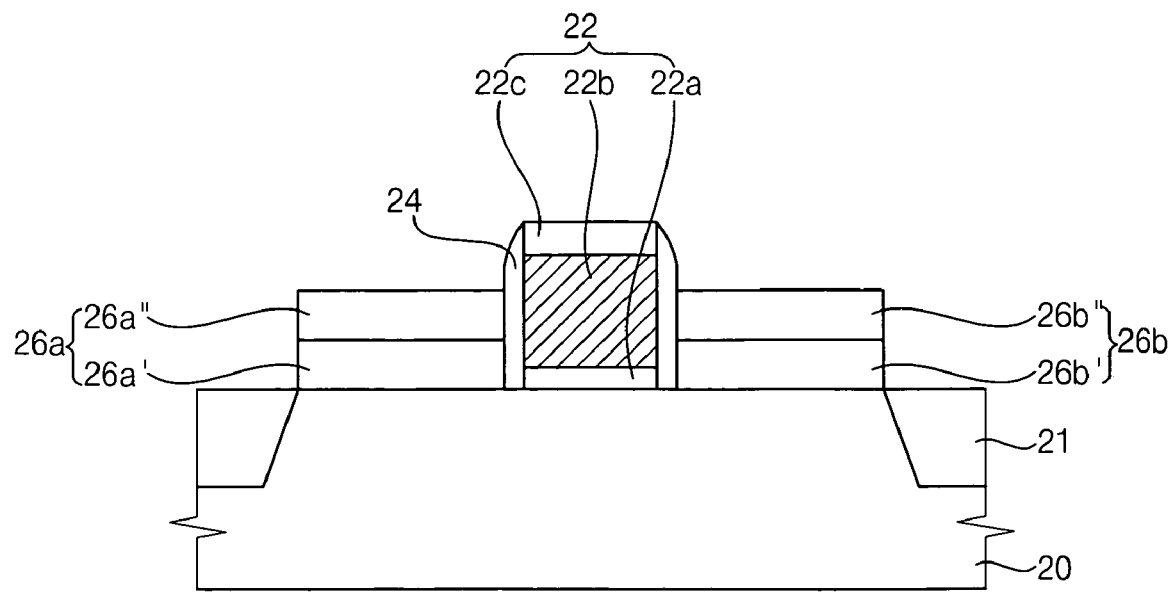
FIG. 2 is a cross-sectional view illustrating a field effect transistor of a semiconductor memory device having elevated source/drain regions according to embodiments of the present invention.

FIG. 2 is a cross-sectional view illustrating a field effect transistor of a semiconductor (integrated circuit) memory device having elevated source/drain regions according to some embodiments of the present invention. As shown in the embodiments of FIG. 2, the semiconductor memory device includes a gate pattern 22 formed on a semiconductor (integrated circuit) substrate 20. A gate spacer 24 is formed on a sidewall of the gate pattern 22. More particularly, for the illustrated embodiments of FIG. 2, an isolation layer 21 is formed in the semiconductor substrate 20 to define an active region and a field region of the semiconductor substrate 20. The gate pattern 22 and the gate spacer 24 are formed on the active region.

In the embodiments of FIG. 2, a trench isolation layer may be used as the isolation layer 21. The trench isolation layer may have advantages compared to a field oxide layer for high integration density devices. The semiconductor substrate 20 may include be single-crystalline silicon substrate, a single-crystalline germanium substrate, a single-crystalline silicon-germanium substrate and/or the like.

The illustrated gate pattern 22 includes a gate insulation layer 22a, a gate conductive layer 22b and a hard mask layer 22c, which may be sequentially stacked. The gate insulation layer 22a may be an oxide layer, a metal oxide layer and/or the like. In some embodiments the gate insulation layer 22a is a metal oxide layer as will be further described herein. The metal oxide layer may have a thin equivalent oxide thickness (EOT) and may also sufficiently reduce leakage currents between the gate conductive layer 22b and a channel region, i.e., a portion of the semiconductor substrate 20 beneath the gate pattern 22. The metal oxide layer may, for example, be $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$ and/or the like. These materials can be used alone or in a combination thereof.

The gate conductive layer 22b may be a polysilicon layer, a metal layer, a metal silicide layer and/or the like. In some embodiments, the gate conductive layer 22b is a polysilicon layer. Further, the hard mask layer 22c may be a silicon nitride layer. In some embodiments, the semiconductor memory device may not include the hard mask layer 22c. The gate spacer 24 may be a silicon nitride spacer, which may be formed by an overall etching process using an etching selectivity.

The semiconductor memory device of the embodiments of FIG. 2 includes source/drain regions 26a and 26b. The source/drain regions 26a and 26b may be formed on a surface of the semiconductor substrate 20 and may be formed to operatively contact the gate spacer 24. More particularly, the source/drain regions 26a and 26b in some embodiments have an elevated structure that may of improve a short channel effect under a condition that the gate pattern 22 has a width of no more than about 0.35 µm.

The elevated source/drain regions 26a and 26b are formed by a selective epitaxial growth (SEG) process. In some embodiments, the SEG process includes a first SEG process carried out at a first temperature to form a first layer, and a second SEG process carried out at a second temperature to form a second layer, the second temperature being lower than the first temperature. When the first SEG process is carried out at the first temperature, although facets at the first layer of the source/drain regions 26a and 26b are typically generated, the first layer may still have some properties improved by the use of a higher temperature. In contrast, when the second SEG process is carried out at the second temperature lower than the first temperature, although some properties of the second layer (properties that are benefited by the higher temperature of the first process) may be deteriorated, the risk of generation of facets during formation of the second layer on the first layer may be reduced or eliminated.

In some embodiments, the elevated source/drain regions 26a and 26b include the first layers 26a' and 26b' that are formed on the semiconductor substrate 20 by the first SEG process at the first temperature, and the second layers 26a" and 26b" that are formed on the first layers 26a' and 26b' by the second SEG process at the second temperature. As a result, the first layers 26a' and 26b', as they are positioned beneath the second layers 26a" and 26b", may not be damaged by impurities implanted into the elevated source/drain regions 26a and 26b. Further, the second layers 26a" and 26b" may make operative contact with the gate spacer 24 due to the reduced incidence or even elimination of the facets. As a result, the impurities may be less deeply implanted into the elevated source/drain regions 26a and 26b.

The elevated source/drain regions 26a and 26b may be doped with the impurities. Examples of the doping impurities may include boron (B), phosphorous (P), arsenic (As) and/or the like.

IN the illustration of FIG. 2, the elevated source/drain regions 26a and 26b are not differentiated with respect to their function. However, for example, the first and second layers 26a' and 26a" that are disposed on the left side of the gate pattern 22 may correspond to the source region 26a, and the first and second layers 26b' and 26b" that are disposed on the right side of the gate pattern 22 may correspond to the drain region 26b or vice-versa.

A method of manufacturing a field effect transistor of a semiconductor memory device having elevated source/drain regions according to some embodiments of the present invention will now be described with reference to FIGS. 3A to 3E. FIGS. 3A to 3E are cross-sectional views illustrating a method of manufacturing the semiconductor memory device illustrated in FIG. 2.

Figure 3A:
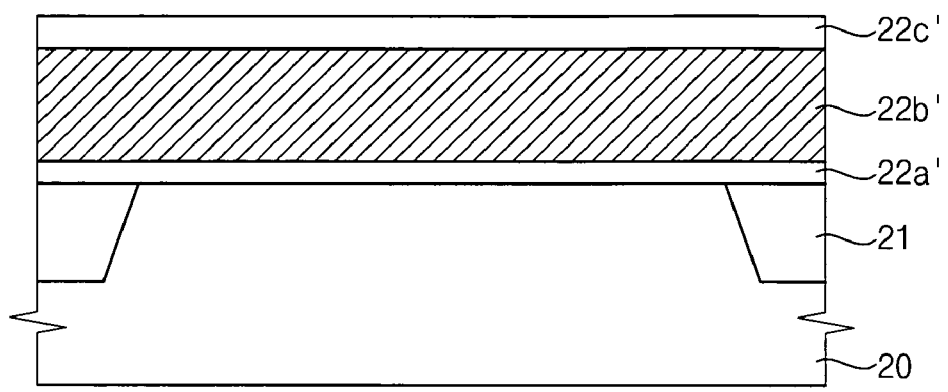
FIGS. 3A to 3E are cross-sectional views illustrating a method of manufacturing the field effect transistor of a semiconductor memory device of FIG. 2 according to some embodiments of the present invention.

Referring to FIG. 3A, the semiconductor substrate 20, such as a single-crystalline silicon substrate, a single-crystalline germanium substrate, a single-crystalline silicon germanium substrate and/or the like is provided. For purposes of description herein, the substrate 20 is a single-crystalline silicon substrate.

An isolation process is carried out to form the isolation layer 21 in the semiconductor substrate 20. As illustrated in FIG. 3A, a trench isolation layer is used as the isolation layer 21. The trench isolation layer may be formed by an etching process, a stacking process and/or a planarizing process. In some embodiments, the trench isolation layer may be formed using oxide by a plasma-enhanced chemical vapor deposition (PECVD) process. The isolation layer 21 defines the active region and the field region of the semiconductor substrate 20.

An insulation layer 22a' is formed on the semiconductor substrate 20 including the isolation layer 21. The insulation layer 22a' will be used to form the gate insulation layer 22a. The insulation layer 22a' may be an oxide layer, a metal oxide layer, a metal oxynitride layer and/or the like. For purposes of description herein, the insulation layer 22a' is a metal oxide layer having a thin equivalent oxide thickness (EOT) and a good leakage current characteristic. The metal oxide layer may be formed by an atomic layer deposition (ALD) process. Thus, the insulation layer 22a' may be formed by the ALD process.

A conductive layer 22b' is formed on the insulation layer 22a'. The conductive layer 22b' will be used as the gate conductive layer 22b. Thus, the conductive layer 22b' may be a polysilicon layer, a metal layer, a metal nitride layer, a metal silicide layer and/or the like. In some embodiments, to provide the semiconductor memory device with improved electrical characteristics, the gate conductive layer 22b may have a multi-layered structure. Therefore, the conductive layer 22b' may also have a multi-layered structure. In some embodiments, the conductive layer 22b' includes a metal layer and a metal nitride layer that may be sequentially stacked. The conductive layer 22b' having the multi-layered structure may be formed, for example, by a CVD process.

As shown in FIG. 3A, a layer 22c' is formed on the conductive layer 22b'. The layer 22c' may be converted into the hard mask layer 22c of the gate pattern 22 as an etching mask. The layer 22c' may include silicon nitride. In some embodiments, the process for forming the layer 22c' (and, thus, the layer 22c) may be omitted.

Figure 3B:
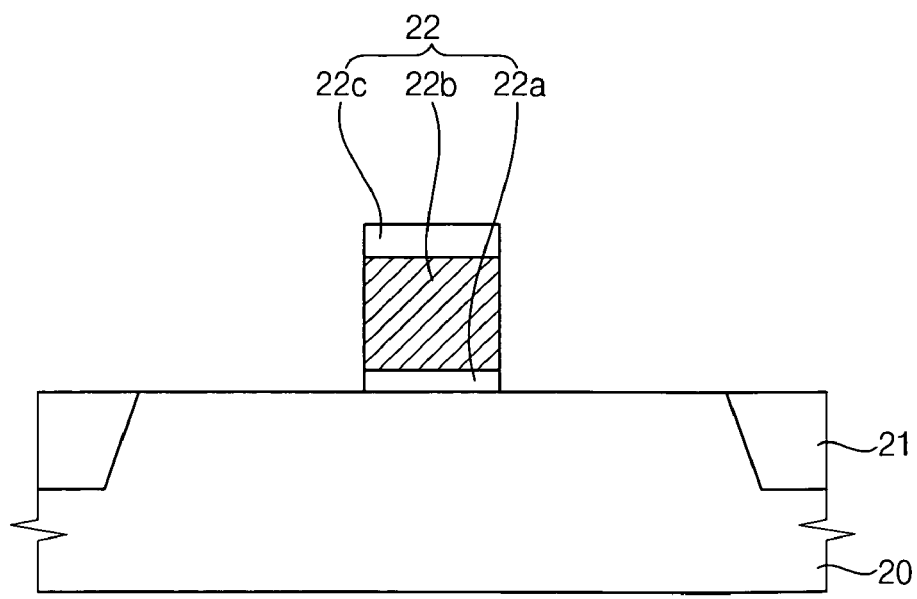

Referring now to FIG. 3B, the insulation layer 22a', the conductive layer 22b' and the layer 22c' are patterned to form the gate insulation layer 22a, the gate conductive layer 22b and the hard mask layer 22c on the active region of the semiconductor substrate 20. In some embodiments, the insulation layer 22a' and the conductive layer 22b' may be etched using the hard mask layer 22c as an etching mask to form the gate insulation layer 22a and the gate conductive layer 22b. When the hard mask layer 22c is not formed, the insulation layer 22a' and the conductive layer 22b' may be etched using, for example, a photoresist pattern as an etching mask.

Figure 3C:
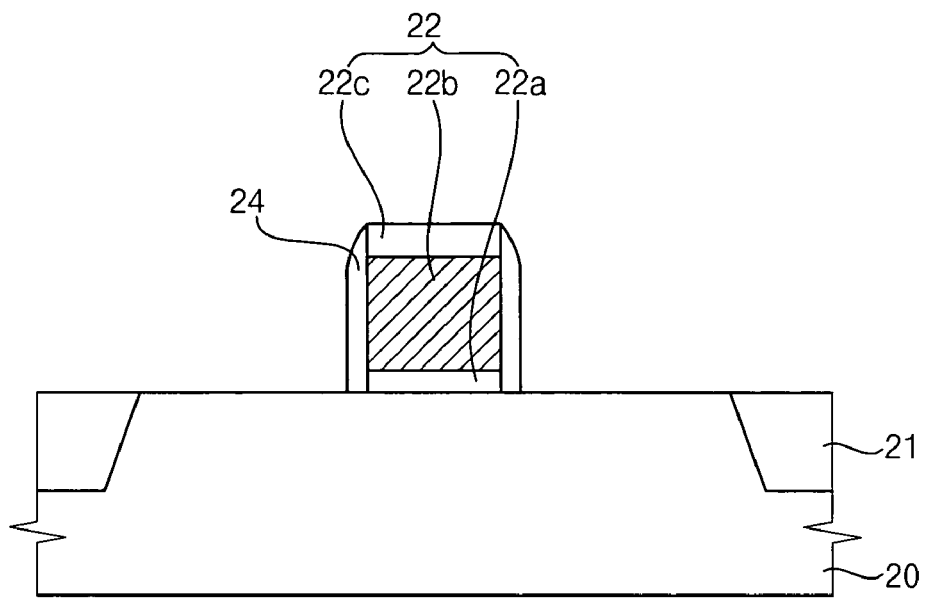

Referring next to FIG. 3C, the gate spacer 24 is formed on the sidewall of the gate pattern 22. A layer (not shown) may first be formed on the semiconductor substrate 20 and the gate pattern 22. The layer may be a silicon nitride layer. The layer may be etched to expose an upper face of the gate pattern 22. In other words, most of the layer is removed so that the layer remains only on the sidewall of the gate pattern 22. The remaining layer forms the gate spacer 24. While performing the overall etching process, the hard mask layer 22c of the gate pattern 22 may be partially etched, because the hard mask layer 22c may be formed of a silicon oxide material that is substantially the same as that of the gate spacer 24. Nonetheless, the overall etching process may be carried out until an upper face of the hard mask layer 22c is exposed to form the gate spacer 24 on the sidewall of the gate pattern 22.

Figure 3D:
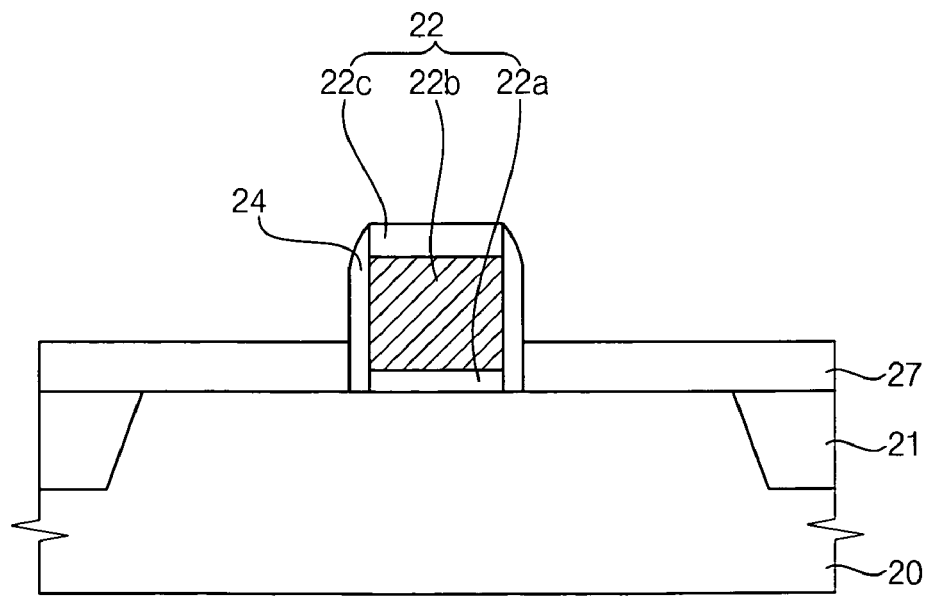

Referring next to FIG. 3D, the first SEG process is carried out to grow the first layer 27 from the surface of the semiconductor substrate 20. The first layer 27 may be formed so as to sufficiently contact the gate spacer 24. The first layer 27 may be, for example, a single-crystalline silicon layer, a single-crystalline germanium layer, a single-crystalline silicon-germanium layer and/or the like. As the semiconductor substrate 20 is used as a seed layer, the first layer 27 for the example of a single silicon substrate 20 also may have a single-crystalline structure. In other words, the first layer 27 may be a single-crystalline silicon layer.

The first SEG process is carried out at the first temperature to form the first layer 27. In some embodiments, the first temperature is higher than the second temperature. When the first temperature is below about 630° C., the first layer 27 may be slowly formed so that the productivity of the manufacturing process for forming the semiconductor memory device may be decreased. In contrast, when the first temperature is above about 700° C., excessive numbers of facets may be generated at edge portions of the first layer 27. Thus, the first SEG process in some embodiments is performed at a temperature of about 630° C. to about 700° C.

As mentioned above, when the first SEG process is carried out at the first temperature, the first layer 27 may have desired properties. For example, the first layer 27 may have good interface characteristics. However, facets may be generated at the first layer 27 formed by the first SEG process at the first temperature.

The first SEG process may be carried out using a first source gas flow at a first flow rate for a first duration after a temperature in an SEG processing chamber reaches the first temperature. The first duration in some embodiments is longer than a second duration used to form the second layer 28 and the first flow rate is less than a second flow rate used to form the second layer 28. In particular embodiments, the first duration may last about 20 seconds to about 30 seconds. Further, the first flow rate may be about 70 sccm to about 90 sccm. The first source gases flowing at the first flow rate may vary in accordance with the type of the first layer 27. For example, when the first layer 27 is a single-crystalline silicon layer, examples of the first source gases may include $SiH_4$, $Si_2H_6$, $Si_3H_8$, $SiH_3Cl$, $Si_2H_2Cl_2$, $SiHCl_3$, and/or the like. When the first layer 27 is a single-crystalline germanium layer, examples of the first source gases may include $GeH_4$, $GeF_4$, and/or the like.

As described for some embodiments above, the first SEG process is carried out by introducing the first source gas at a temperature of about 630° C. to about 700° C. for 20 seconds to about 70 seconds. Furthermore, the first source gas flows at a flow rate of about 70 sccm to about 90 sccm to form the first layer 27. In addition, as a thickness of the first layer 27 is dependent upon a desired resultant thickness of the source/drain regions 26a and 26b, the thickness of the first layer 27 may be controlled within a range of about 5 Å and about 95 Å in some embodiments.

After performing the first SEG process under the above-mentioned conditions, although facets at the edge portions of the first layer 27 may be generated, the obtained first layer 27 may have desireable properties, such as the interface characteristics. Thus, the first layer 27 may have reduced or even no damage caused during doping the impurities so that the first layer 27 may be provided with good electrical characteristics.

In some embodiments, after forming the first layer 27, the first layer 27 may be further surface-treated. The surface treatment of the first layer 27 may be carried out, for example, by an etching process using $Cl_2$. Further, when the first layer 27 is formed prior to the surface treatment, a purge process may be performed to remove the source gas. The process for forming the first layer 27 and the process for surface-treating the first layer 27 may be repeatedly carried out in some embodiments.

Figure 3E:
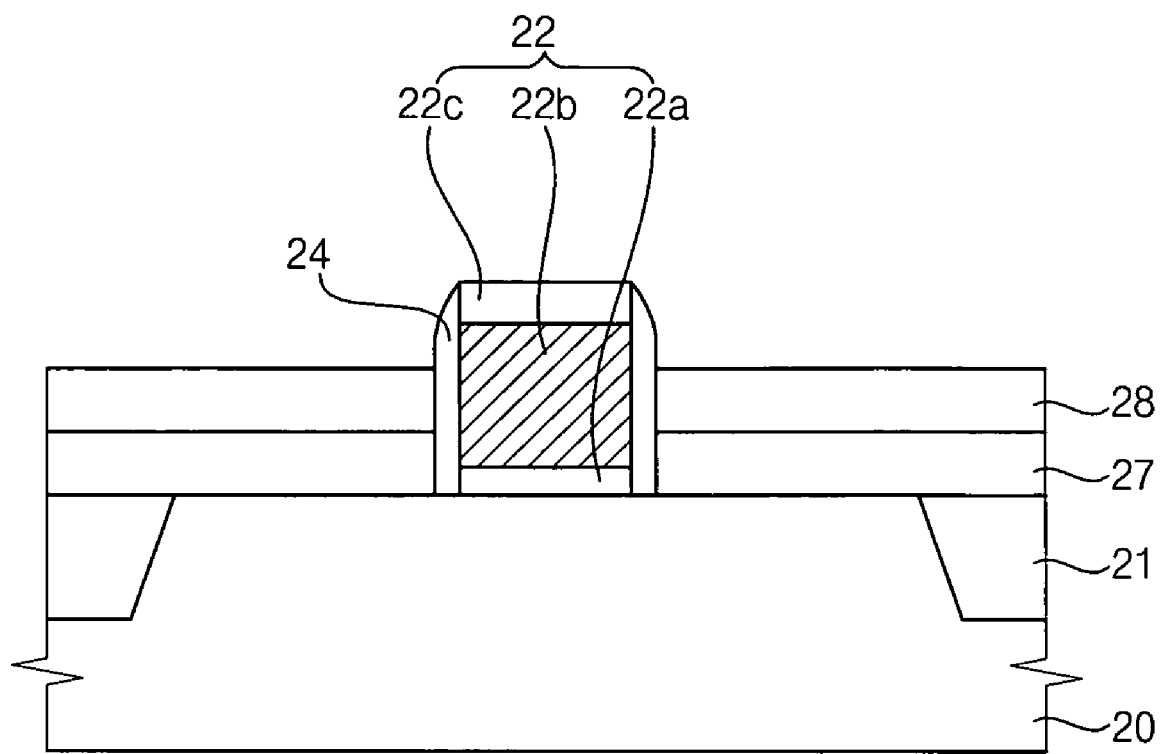

Referring now to FIG. 3E, the second SEG process is carried out to grow the second layer 28 from a surface of the first layer 27. The second layer 28 may be formed to provide operative contact with the gate spacer 24. Examples of the second layer 28 may include a single-crystalline silicon layer, a single-crystalline germanium layer, a single-crystalline silicon-germanium layer, and/or the like. In particular embodiments, as the second layer 28 is dependent upon the first layer 27, the second layer 28 may include a material substantially the same as that of the first layer 27. For example, when the first layer 27 is a single-crystalline silicon layer, the second layer 28 may also be a single-crystalline silicon layer. In other words, as the first layer 27 is used as a seed layer, the second layer 28 also has a single-crystalline structure.

The second SEG process is carried out at the second temperature to form the second layer 28. The second temperature is lower than the first temperature. When the second temperature is below about 600° C., the second SEG process may be insufficiently performed so that the second layer 28 may be slowly formed. In contrast, if the second temperature is above about 670° C., the second SEG may be carried out under conditions resulting in similar problems as those of the first SEG process. That is, when the second temperature is above about 670° C., excessive numbers of facets may be generated at edge portions of the second layer 28. Thus, in some embodiments, the second SEG process is performed at a temperature of about 600° C. to about 670° C. In some embodiments, the second SEG process is performed at a temperature of about 620° C. to about 640° C.

As mentioned above, when the second SEG process is carried out at the second temperature, the facets may not be generated at the edge portions of the second layer 28. In contrast, the second layer 28 may have interface characteristics slightly worse than those of the first layer 27.

The second SEG process may be carried by flowing a second source gas at the second flow rate for the second duration once the processing chamber reaches the second temperature. In some embodiments, the second duration is shorter than the first duration and the second flow rate is greater than the first flow rate. In some embodiments, the second duration may last about 15 seconds to about 25 seconds and the second flow rate may be about 80 sccm to about 100 sccm. The second source gases flowing at the second flow rate may vary in accordance with type of the second layer 28. For example, when the second layer 28 is a single-crystalline silicon layer, examples of the second source gases may include $SiH_4$, $Si_2H_6$, $Si_3H_8$, $SiH_3Cl$, $Si_2H_2Cl_2$, $SiHCl_3$, and/or the like. When the second layer 28 is a single-crystalline germanium layer, examples of the source gases may include $GeH_4$, $GeF_4$, and/or the like. As the second layer 28 is dependent upon the first layer 27, the second source gas may be substantially the same as the first source gas.

As described above, in some embodiments, the second SEG process is carried out by introducing the second source gas at a temperature of about 600° C. to about 670° C. for about 15 seconds to about 25 seconds at a flow rate of about 80 sccm to about 100 sccm in order to form the second layer 28. As a thickness of the second layer 28 is dependent upon a desired resultant thickness of the source/drain regions 26a and 26b, the thickness of the second layer 28 may be controlled within a range of about 5 Å and about 95 Å in some embodiments.

After performing the second SEG process under the above-mentioned conditions, although the properties, such as the interface characteristics of the second layer 28, may be deteriorated, the facets may not be generated at the edge portions of the second layer 28. Therefore, the second layer 28, which sufficiently makes contact with the gate spacer 24, is used for the elevated source/drain regions 26a and 26b. As a result, while the elevated source/drain regions 26a and 26b are doped with impurities, the impurities may not be deeply implanted into the elevated source/drain regions 26a and 26b, because the facets do not exist at the elevated source/drain regions 26a and 26b. Thus, the short channel effect caused by the deeply implanted impurities may be suppressed.

Additionally, in some embodiments, the second layer 28 may be further surface-treated after being formed. The surface treatment of the second layer 28 may be carried out by an etching process using $Cl_2$ substantially the same as that for treating the first layer. When the second layer 28 is formed prior to the surface treatment, a purge process may be performed to remove the second source gas. Furthermore, the process for forming the second layer 28 and the process for surface-treating the second layer 28 may be repeatedly carried out in some embodiments.

The first and second layers 27 and 28 may be doped with impurities. Examples of the impurities may include boron, phosphorous, arsenic, and/or the like. Further, the doping process may include an ion implantation process using a photoresist pattern as an ion implantation mask. As the second layer 28 sufficiently makes contact with the gate spacer 24 without the facets in some embodiments, the first and second layers 27 and 28 may be uniformly doped with the impurities. Further, as the first layer 27 has good interface characteristics in some embodiments, the first layer 27 may not be damaged in the ion implantation process.

The first and second layers 27 and 28 may be patterned to form the elevated source/drain regions 26a and 26b on the semiconductor substrate 20.

According to some embodiments of the present invention, the elevated source/drain regions include the first layer having the good interface characteristics, and the second layer without the facets on the first layer. That is, the first and second layers in the elevated source/drain regions may selectively include relatively advantageous characteristics. Therefore, the elevated source/drain regions may have a good electrical reliability.

According to some embodiments of the present invention, the source/drain regions include the first layer formed from the surface of the semiconductor substrate by the first SEG process at the first temperature, and the second layer formed from the surface of the first layer by the second SEG process at the second temperature lower than the first temperature. In some embodiments, when the first SEG process is carried out at the first temperature, although facets are generated at the first layer, the first layer may have good properties. That is, the first layer may not be damaged in doping the impurities. In contrast, when the second SEG process is carried out at the second temperature lower than the first temperature, the facets may not be generated at the second layer, although properties of the second layer may be deteriorated. Therefore, the elevated source/drain regions having the first and second layers may not be damaged in doping the impurities without facets. As a result, the elevated source/drain regions having the first and second layers may be readily employed in a semiconductor memory device having a gate pattern that has a width of no more than about 0.35 µm.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a field effect transistor, comprising:

forming a gate pattern on a substrate;
   forming a gate spacer on a sidewall of the gate pattern;
   forming a first layer from a surface of the substrate and contacting the gate spacer using a first selective epitaxial growth (SEG) process at a first temperature; and
   forming a second layer from a surface of the first layer and contacting the gate spacer using a second SEG process at a second temperature lower than the first temperature, the first and second layers defining elevated source/drain regions,
   wherein forming the first layer comprises introducing a first source gas at a first flow rate for a first duration and wherein forming the second layer comprises introducing a second source gas at a second flow rate greater than the first flow rate for a second duration shorter than the first duration.

2. The method of claim 1, wherein the substrate comprises a single-crystalline silicon substrate, a single-crystalline germanium substrate and/or a single-crystalline silicon germanium substrate and wherein the first and second layers comprise a single-crystalline silicon layer, a single-crystalline germanium layer and/or a single-crystalline silicon germanium layer.

3. The method of claim 1, wherein forming the first layer comprises forming the first layer at between about 630° C. to about 700° C. and wherein forming the second layer comprises forming the second layer at between about 600° C. to about 670° C.

4. The method of claim 1, wherein forming the first layer comprises introducing the first source gas at about 70 sccm to about 90 sccm for about 20 seconds to about 30 seconds and wherein forming the second layer comprises introducing the second source gas at about 80 sccm to about 100 sccm for about 15 seconds to about 25 seconds.

5. The method of claim 1, wherein the first and second source gases comprise $SiH_4$, $Si_2H_6$, $Si_3H_8$, $SiH_3Cl$, $Si_2H_2Cl_2$ and/or $SiHCl_3$.

6. The method of claim 1, wherein forming the first and second layers comprise forming the first and second layers to a thickness of about 5 Å to about 95 Å.

7. The method of claim 1, wherein forming the first layer and forming the second layer are followed by doping the first and second layers with impurities.

8. The method of claim 7, wherein the impurities comprise boron, phosphorous and/or arsenic.

9. The method of claim 1, wherein forming the first layer comprises:

forming a portion of the first layer; and then
   surface-treating the formed portion of the first layer; and
   repeating forming the portion of the first layer and treating the formed portion of the first layer.

10. The method of claim 1, wherein forming the second layer comprises:

forming a portion of the second layer; and then
    surface-treating the formed portion of the second layer; and
    repeating forming the portion of the second layer and treating the formed portion of the second layer.

11. The method of claim 1, wherein forming the first layer comprises forming the first layer with an associated crystal grain size and wherein forming the second layer comprises forming the second layer with an associated crystal grain size different from the associated crystal grain size of the first layer.

12. The method of claim 1, wherein forming the first layer comprises forming the first layer with an associated interface characteristic and wherein forming the second layer comprises forming the second layer with an associated interface characteristic lower than the interface characteristic of the first layer.

13. The method of claim 1, wherein forming the first layer comprises forming the first layer with an associated incidence of facets at an interface thereof with the gate spacer and wherein forming the second layer comprises forming the second layer with an associated incidence of facets at an interface thereof with the gate spacer lower than the incidence of facets at an interface of the first layer with the gate spacer.

14. The method of claim 13, wherein forming the first layer and forming the second layer are followed by uniformly doping the first and second layers with impurities.

15. The method of claim 14, wherein forming the first layer comprises forming the first layer at between about 630° C. to about 700° C. and wherein forming the second layer comprises forming the second layer at between about 600° C. to about 670° C.

16. The method of claim 15 wherein forming the second layer comprises forming the second layer at between about 620° C. to about 640° C.

17. The method of claim 1, wherein the first and second SEG processes comprise a single SEG process performed with a decreasing temperature during the single SEG process to provide the elevated source/drain regions.

* * * * *